United States Patent
Sun et al.

(10) Patent No.: US 7,943,399 B2
(45) Date of Patent: May 17, 2011

(54) SPIN-CURRENT SWITCHED MAGNETIC MEMORY ELEMENT SUITABLE FOR CIRCUIT INTEGRATION AND METHOD OF FABRICATING THE MEMORY ELEMENT

(75) Inventors: Jonathan Zanhong Sun, Shrub Oak, NY (US); Rolf Allenspach, Adliswil (CH); Stuart Stephen Papworth Parkin, San Jose, CA (US); John Casimir Slonczewski, Katonah, NY (US); Bruce David Terris, Sunnyvale, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/548,428

(22) Filed: Aug. 27, 2009

(65) Prior Publication Data

US 2009/0317923 A1 Dec. 24, 2009

Related U.S. Application Data

(62) Division of application No. 10/715,376, filed on Nov. 19, 2003, now Pat. No. 7,602,000.

(51) Int. Cl.
*H01L 21/00* (2006.01)
(52) U.S. Cl. ............... 438/3; 438/48; 438/71; 257/295; 257/421; 257/E21.665
(58) Field of Classification Search ............... 438/3, 48, 438/71; 257/295, 421, 422, E21.665
See application file for complete search history.

(56) References Cited

U.S. PATENT DOCUMENTS

| | | | |
|---|---|---|---|
| 5,432,373 A * | 7/1995 | Johnson | 257/421 |
| 5,695,864 A | 12/1997 | Slonczewski | |
| 5,792,569 A | 8/1998 | Sun et al. | |
| 5,917,749 A | 6/1999 | Chen et al. | |
| 6,341,053 B1 | 1/2002 | Nakada et al. | |
| 6,545,906 B1 | 4/2003 | Savtchenko et al. | |
| 6,703,676 B2 | 3/2004 | Hirai et al. | |
| 6,744,086 B2 | 6/2004 | Daughton et al. | |
| 6,958,927 B1 | 10/2005 | Nguyen et al. | |
| 7,313,013 B2 | 12/2007 | Sun et al. | |

OTHER PUBLICATIONS

V. Huai, et al. "Observation of Spin-Transfer Switching in Submicron-sized and Low-Resistance Magnetic Tunnel Junctions", http://mmm.abstractcentral.com, 2003, Abstract only.
Liu, et al., "Current-Induced Magnetization Switching in Magnetic Tunnel Junctions", Applied Physics Letters, vol. 82, No. 17, Apr. 28, 2003, pp. 2871-2873.
J.A. Katine, et al., "Current-Driven Magntization Reversal and Spin-Wave Excitation in Co/Cu/Co Pillars", Physical Review Letters, vol. 84, No. 14, Apr. 3, 2000, pp. 3149-3152.
J.Z. Sun, "Current-Driven Magnetic Switching in Manganite Trilayer Junctions", Journal of Magnetism and Magnetic Materials 202 (1999), Dec. 29, 1998, pp. 157-162.

* cited by examiner

*Primary Examiner* — Thinh T Nguyen
(74) *Attorney, Agent, or Firm* — McGinn IP Law Group, PLLC

(57) ABSTRACT

A magnetic memory element switchable by current injection includes a plurality of magnetic layers, at least one of the plurality of magnetic layers having a perpendicular magnetic anisotropy component and including a current-switchable magnetic moment, and at least one barrier layer formed adjacent to the plurality of magnetic layers (e.g., between two of the magnetic layers). The memory element has the switching threshold current and device impedance suitable for integration with complementary metal oxide semiconductor (CMOS) integrated circuits.

14 Claims, 5 Drawing Sheets

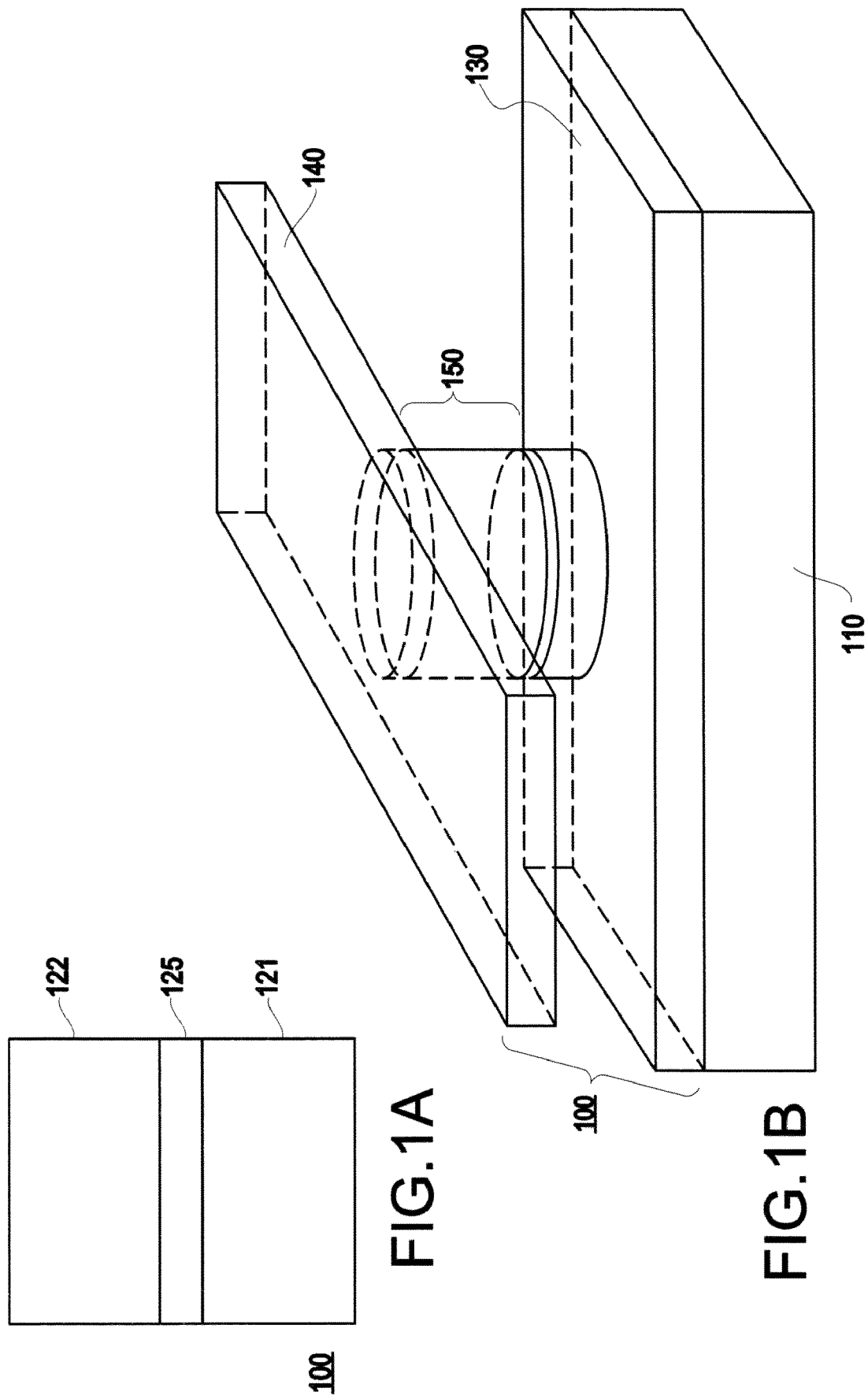

SPIN-CURRENT SWITCHED MAGNETIC MEMORY ELEMENT SUITABLE FOR CIRCUIT INTEGRATION AND METHOD OF FABRICATING THE MEMORY ELEMENT

RELATED APPLICATIONS

This Application is a Divisional Application of U.S. patent application Ser. No. 10/715,376 filed on Nov. 19, 2003 now U.S. Pat. No. 7,602,000.

BACKGROUND OF THE INVENTION

1. Field of the Invention

The present invention relates to a spin-current switched magnetic memory element having a plurality of layers (e.g., magnetic layers) and a method of fabricating the memory element, and more particularly, to a spin-current switched magnetic memory element including a plurality of layers, in which at least one of the magnetic layers has a perpendicular magnetic anisotropy component. The memory element has the switching threshold current and device impedance suitable for integration with complementary metal oxide semiconductor (CMOS) integrated circuits.

2. Description of the Related Art

Spin-current injection switches represent a new class of memory devices that can be scaled down to the size of at least about 10 nm. These devices use spin polarized current injection to switch magnetic bits.

There is an intense search for a two terminal current-switchable spin-valve or magnetic tunneling-based device for memory applications. If such devices can be found with adequate switching current for writing and proper impedance and signal level for reading, it will bring possibilities for a new architecture to magnetic random access memory (MRAM).

For a thin film nanomagnet memory element, the threshold current necessary to induce such a switch is directly proportional to the combined magnetic anisotropy ($4\pi Ms+H$), where $4\pi Ms$ is the easy-plane shape anisotropy, and H represents the additional uniaxial anisotropy and/or applied magnetic field.

However, the experimentally demonstrated threshold current for a thin film nanomagnet of 60 nm×120 nm×2 nm is about 1 mA. This required current is too high (e.g., by at least an order of magnitude) for successful insertion of these devices into current-generation complementary metal oxide semiconductor (CMOS) circuits.

In addition, to date all spin transfer-switching devices use the metal-based current perpendicular (CPP) spin valve structure, which has too low an impedance for fast read-out using a CMOS-based circuit. Magnetic tunneling junctions will have higher impedances that can be compatible with CMOS requirements. However, to date no clear demonstration has been made that such spin-transfer-based magnetic switching exists in magnetic tunneling junctions. This is because of two factors.

First, the normal, magnetization-in-plane magnetic film has too large an easy-plane de-magnetization field (e.g., on the order of 1.8 Tesla for cobalt, for example), which causes the switching current density to be too high (e.g., on the order of $10^7$ A/cm$^2$), as measured using a spin-valve type of switches, which has been demonstrated by the inventors as well as others. Secondly, the breakdown current density is too low in magnetic tunneling devices, typically below $10^5$/cm$^2$, for successful combination of a tunneling device with a spin-transfer switch.

Thus, two terminal current-switchable spin-valve or magnetic tunneling-based devices have not been efficiently and effectively used for conventional magnetic memory applications.

SUMMARY OF THE INVENTION

In view of the foregoing and other exemplary problems, disadvantages, and drawbacks of the aforementioned systems and methods, it is a purpose of the exemplary aspects of the present invention to provide a spin-current switched magnetic memory element (e.g., a spin-current injection device) having a reduced switching current threshold and an increased device impedance, and a method of fabricating the memory element.

An exemplary aspect of the present invention includes a magnetic memory element which is switchable by current injection. The memory element includes a plurality of magnetic layers, at least one of the plurality of magnetic layers having a perpendicular component of magnetic anisotropy (e.g., a perpendicular magnetic anisotropy component) and including a current-switchable magnetic moment, and at least one barrier layer formed adjacent to the plurality of magnetic layers (e.g., between two magnetic layers). The memory element has the switching threshold current and device impedance suitable for integration with complementary metal oxide semiconductor (CMOS) integrated circuits.

The plurality of magnetic layers may include at least one composite layer. For example, the at least one composite layer may include a platinum layer and a cobalt layer. The at least one composite layer may also include a gold layer and a cobalt layer, or a nickel layer and a copper layer.

Further, the perpendicular magnetic anisotropy component may be formed between layers in at least one composite layer. The perpendicular magnetic anisotropy component may also include a bulk perpendicular magnetic anisotropy component of intrinsic material or magnetoelastic origin which may be formed in the at least one composite layer.

The memory element may also include first and second leads, and a pillar formed between the first and second leads, the pillar including the at least one barrier layer and at least one magnetic layer of the plurality of magnetic layers. Further, the at least one magnetic layer included in the pillar may include the current-switchable magnetic moment. In addition, the magnetic moment of the at least one magnetic layer included in the pillar may be switchable by an electrical current having a density of no more than about $10^6$ A/cm$^2$. In addition, at least one of the first and second leads may include a magnetic layer of the plurality of magnetic layers.

The pillar may include a lithographed pillar having a diameter of less than about 100 nm. The pillar may also include an oblong-shaped (e.g., oval-shaped) cross section. The pillar may have an electrical resistance which depends on a magnetization direction of the lower magnetic layer with respect to a magnetization direction of the upper layer. For example, the barrier may be a tunneling barrier, in which case the pillar may include a magnetic tunneling junction across the barrier layer between the upper and lower magnetic layers.

The barrier may also be a non-magnetic metallic conductor such as copper, in which case the pillar may include a current-perpendicular spin-valve structure between the upper and lower magnetic layers. The barrier may also be a non-magnetic semiconductor or a doped semiconductor or insulator such as $SrTiO_3$ which by chemical substitution (e.g., Nb) can become metallic. In such a case the pillar may include a ferromagnet-semiconductor-ferromagnet junction.

A function of the barrier layer may include preserving spin information for an electric current injected into the pillar and providing a resistance (e.g., a sufficient resistance) to the current. The barrier may be a composite layer formed by more than one material and/or layers. The barrier layer may also be alternately formed with the plurality of magnetic layers.

Specifically, the barrier layer may include a tunneling barrier layer. The tunneling barrier layer may include one of aluminum oxide and magnesium oxide or a composite of both.

The plurality of magnetic layers may include an upper magnetic layer and a lower magnetic layer, the at least one barrier layer being formed between the upper and lower magnetic layers. The perpendicular magnetic anistropy may have a magnitude sufficient to at least substantially offset the easy-plane demagnetization effect, such that a magnetic moment of one of the upper and lower magnetic layers may be either resting out of the film plane or can be easily rotated out of the film plane under spin current excitation.

The upper magnetic layer may include one of a platinum layer formed on a cobalt layer, and a gold layer formed on a cobalt layer. The lower magnetic layer may include one of a cobalt layer formed on a platinum layer, a cobalt layer formed on a gold layer, and a nickel layer formed on a copper layer.

Further, the lower magnetic layer may include a first nickel layer formed on a first copper layer, and the upper magnetic layer may include a second copper layer formed on a second nickel layer. The second nickel layer may have a thickness which is less than a thickness of the first nickel layer, and may have a magnetic moment which is perpendicular to a film plane.

Further, the second nickel layer may have a magnetic moment corresponding to an information state of the spin-current switched magnetic memory element. The lower magnetic layer may also include a first cobalt layer formed on a first platinum layer, and the upper magnetic layer may include a second platinum layer formed on a second cobalt layer.

In another exemplary aspect, the present invention includes a spin-current switched magnetic memory element, having first and second leads, a pillar formed between the first and second leads, a plurality of magnetic layers, at least one of the plurality of magnetic layers having a perpendicular magnetic anisotropy component and including a current-switchable magnetic moment, and being formed in the pillar, and at least one barrier layer formed adjacent to the plurality of magnetic layers (e.g., between two of the magnetic layers).

The spin-current switched magnetic memory element may further include more than one barrier layer. For example, it may have one non-magnetic metal layer (e.g., a copper layer) formed adjacent to the plurality of magnetic layers. Thus, for example, the plurality of magnetic layers may include a first magnetic layer formed on the first lead, the at least one barrier layer being formed on the first magnetic layer, a second magnetic layer formed on the at least one barrier layer, the at least one non-magnetic metal layer being formed on the second magnetic layer, and a third magnetic layer formed on the non-magnetic metal layer, the second lead being formed on the third magnetic layer.

Another exemplary aspect of the present invention includes a magnetic random access memory (MRAM) array including a plurality of magnetic spin-current switched magnetic memory elements according to the present invention.

Another exemplary aspect of the present invention includes a method of fabricating a spin-current switched magnetic memory element. The method includes forming a plurality of layers which insludes a plurality of magnetic layers, the plurality of magnetic layers including at least one magnetic layer having a perpendicular magnetic anisotropy component and including a current-switchable magnetic moment, and at least one barrier layer formed adjacent to the plurality of magnetic layers (e.g., between two of the magnetic layers).

With its unique and novel features, the present invention provides a magnetic memory element (e.g., a spin-current injection tunneling device) having a switching current threshold which is lower than that of present-day spin-transfer-based memory elements, and an impedance desirable for CMOS circuit integration, and a method of fabricating the magnetic memory element.

BRIEF DESCRIPTION OF THE DRAWINGS

The foregoing and other exemplary purposes, features, aspects and advantages will be better understood from the following detailed description of the exemplary embodiments of the invention with reference to the drawings, in which:

FIG. 1A-1F illustrate a spin-current switched magnetic memory element 100, in accordance with an exemplary aspect of the present invention;

DETAILED DESCRIPTION OF THE EXEMPLARY

Embodiments of the Invention

Figure 1C:
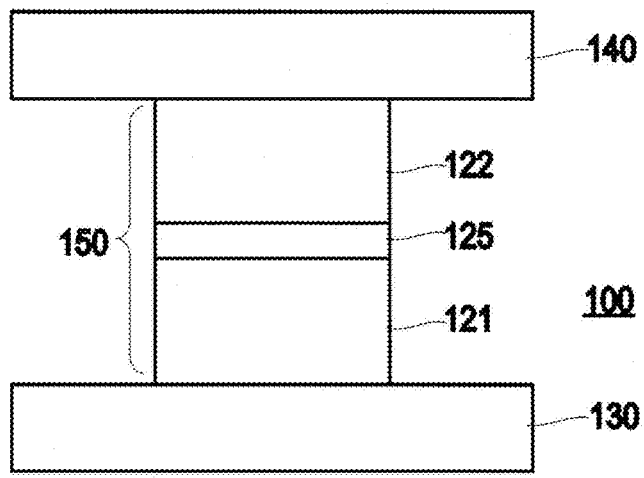

Referring now to the drawings, FIGS. 1A-1F, 2A-2B and 4 illustrate an exemplary aspect of the present invention. Specifically, these figures illustrate a magnetic memory element (e.g., a current-switchable two-terminal magnetic memory element) which may be included, for example, as part of a magnetic random access memory (MRAM) array.

A device having a magnetic layer with current-switchable magnetic moment is described, for example, in U.S. Pat. No. 5,695,864, entitled "ELECTRONIC DEVICE USING MAGNETIC COMPONENTS", and a thin film magneto-resistive device is described, for example, in U.S. Pat. No. 5,792,569, entitled "MAGNETIC DEVICES AND SENSORS BASED ON PEROVSKITE MANGANESE OXIDE MATERIALS", which are assigned to the present Assignee and are incorporated by reference herein.

The exemplary aspects of the present invention make use of a perpendicular component of magnetic anisotropy (e.g., a perpendicular magnetic anisotropy component) for the creation of a magnetic state that is more favorable for low-current switching. The perpendicular anisotropy component may counter the demagnetization field of a magnetic layer (e.g., the switching, or "free" layer, or the fixed, or "pinned" reference magnetic layers, or both) of the magnetic layers that form the thin film switching element), making the magnetic anisotropy which is useful for memory functions the only significant energy barrier that a spin-current switch has to overcome.

As shown in FIG. 1A, the inventive spin-current switched magnetic memory element 100 includes a plurality of magnetic layers 121, 122 including at least one layer having a perpendicular magnetic anisotropy component and including a current-switchable magnetic moment, and at least one barrier layer 125 formed adjacent to the plurality of magnetic layers (e.g., between two of the magnetic layers).

The barrier layer 125 may include a tunneling barrier layer which is formed between two magnetic layers 121, 122. That is, the inventive spin-current switched magnetic memory element may include a magnetic tunneling junction.

As illustrated in FIG. 1B, the spin-current switched magnetic memory element 100 may be formed on a substrate 110 (e.g., semiconductor substrate). Further, the spin-current switched magnetic memory element 100 may include a first lead 130 (e.g., a bottom electrode), and a second lead 140 (e.g., top electrode).

Figure 1D:
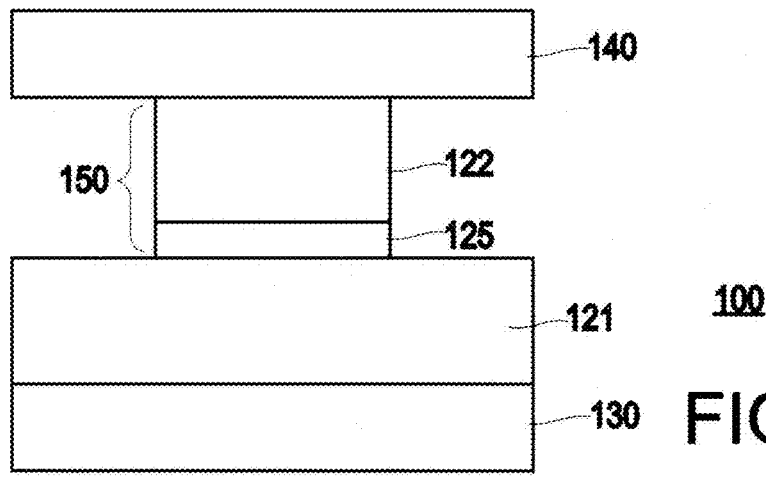

Further, at least one of the plurality of magnetic layers 121, 122 may be included as part of a pillar (e.g., a thin film stack having lateral dimensions on the order of 100 nm) 150 formed between the first and second leads 130, 140. For example, as illustrated in FIG. 1C, all of the magnetic layers 121, 122 may be included in the pillar 150. However, some (e.g., all but one) of the plurality of magnetic layers may be formed outside of the pillar. For example, as shown in FIG. 1D, magnetic layer 122 is formed in the pillar 150, but magnetic layer 121 is not formed in the pillar. Further, a magnetic layer not included in the pillar 150 may be formed as part of the first or second leads 130, 140. It should also be noted that the barrier layer 125 may or may not be formed in the pillar.

In one exemplary aspect (e.g., illustrated in FIG. 1B), the first lead (e.g., bottom contact electrode) 130 may be formed between the substrate 110 and the pillar 150, and the second lead 140 (e.g., top contact electrode) may be formed on a top surface of the plurality of layers and opposite to the bottom contact electrode. The space between bottom lead (element 130) and top lead (element 140) can be filled with an insulating material (e.g., silicon dioxide). An electrical current (e.g., a current having a density of no more than about 10.sup.6 A/cm.sup.2) flowing between the first and second leads 130, 140 via pillar 150 may cause a change in the magnetic moment (e.g., magnetization direction) of one of the plurality of magnetic layers (e.g., magnetic layer 122 in FIGS. 1B-1F).

The present invention proposes a general concept, and a set of specific approaches, to the reduction of the switching current in a magnetic memory element. An important concept of the present invention is to utilize the perpendicular magnetic anisotropy component observed in some magnetic thin films to counter-balance the strong demagnetization effect 4.pi.M-.sub.s, thus removing the main barrier for current-induced magnetic reversal, and reduce the switching current threshold.

A quantitative relationship may be established, both theoretically and with some recent experimental verification, that a threshold current for spin-current induced switching can be expressed as follows:

$$I_c = (1/\eta)(2e/\hbar)a(a^2 l_m M_s)[H_k + H_a + (4\pi M_s - H_p)/2]$$

Where $\eta$ is the spin-polarization factor of the current, e is electron charge, $\hbar = h/2\pi$ is the normalized Planck constant, a is the magnetic damping coefficient, $l_m$ is the film thickness for the switching element layer, $a^2$ is the film area (e.g., lateral size squared), $M_s$ is the saturation magnetization, $H_k$ is the uniaxial anisotropy field due to the elongated pillar cross-section, and $H_p$ is the perpendicular anisotropy field induced either at the interface (such as for the case of Co—Pt interface) or through epitaxy with its strain field (such as the case of Ni eptiaxially grown on copper (110) surface) or intrinsic crystalline anisotropy of the material. The term $(a^2 l_m M_s)(H_k)$ represents the uniaxial anistropy energy of the switching element (e.g., for a blocking temperature $T_b$ which reflects the thermal-stability limit for information storage), $4\pi M_s$ is the easy-plane shape anistropy and $H_a$ is the applied field. Further explanation for material perpendicular anisotropy field $H_p$ is given below.

For most magnetic thin films of interest for magnetic memory applications, the demagnetization term $4\pi M_s$ would be large compared to $H_k$. For cobalt, for example, the term is on the order of 16,000 Oe, whereas $H_k$ is usually less than 1,000 Oe. Ordinarily, the $4\pi M_s$ term is the main factor in controlling the switching current. The demagnetization energy is an easy-plane anisotropy, which is a consequence of the flat geometry of a thin film nanomagnet.

The exemplary aspects of the present invention use the additional materials and/or interface perpendicular magnetic anisotropy energy (whose effect is represented by $H_p$ in the above formula), as a means to counter this force. Specifically, the present invention may reduce the combined perpendicular anisotropy to a value (e.g., a minimum value) that is convenient for a spin-current induced switch.

Specifically, the exemplary aspects of the present invention may utilize two classes of possible mechanisms for perpendicular magnetic anisotropy. One class originates from interface electronic interaction, the other class from bulk structural (e.g., strain) modulation in the plurality of magnetic layers (e.g., strain in a thin film nanomagnet).

A specific example belonging to the first class of mechanisms is the interface-induced perpendicular magnetic anisotropy in thin films (e.g., cobalt-gold films). It has been demonstrated experimentally that ultra-thin Pt/Co/Pt and Au/Co/Au films exhibit perpendicular anisotropy large enough to completely overcome the thin film demagnetization field of cobalt. It has been further demonstrated experimentally that one can place two layers of such materials adjacent to each other with different perpendicular switching field strength.

Thus, referring again to FIGS. 1A-1F, the spin-current switched magnetic memory element may include two magnetic layers 121, 122 separated by a barrier layer 125. For example, the magnetic layers 121, 122 may include cobalt, platinum, gold, copper and nickel layers. Further, the barrier layer (e.g., tunneling barrier) 125 may include aluminum oxide or magnesium oxide. The magnetic layers and barrier layer may be deposited epitaxially (e.g., on a single-crystal substrate).

As illustrated in FIGS. 1B-1F, the barrier layer 125 and at least one of the magnetic layers 121, 122 may be included in the lithographed pillar 150 (e.g., an elongated cylinder-shaped pillar having a lateral size less than about 100 nm). The magnetization (e.g., magnetic moment) of one magnetic layer (e.g., layer 122) may have a fixed orientation, whereas another magnetic layer (e.g., layer 121) may have a switchable magnetization the direction which represents the information state.

In particular, a perpendicular magnetic anistropy may be included in the magnetic layer 122 which may have a magnitude sufficient to offset the easy-plane demagnetization effect $4\pi M_s$ in magnetic layer 122. This helps to reduce the amount of current needed to change the magnetization direction of the magnetic layer 122. Further, incorporation of the barrier layer (e.g., tunneling barrier layer) 125 adjacent to magnetic layer 122 suitable for spin-transfer switching helps to provide a practical signal voltage swing corresponding to the two different magnetic alignment states the adjacent magnetic layers have (e.g. parallel and antiparallel).

Figure 1E:
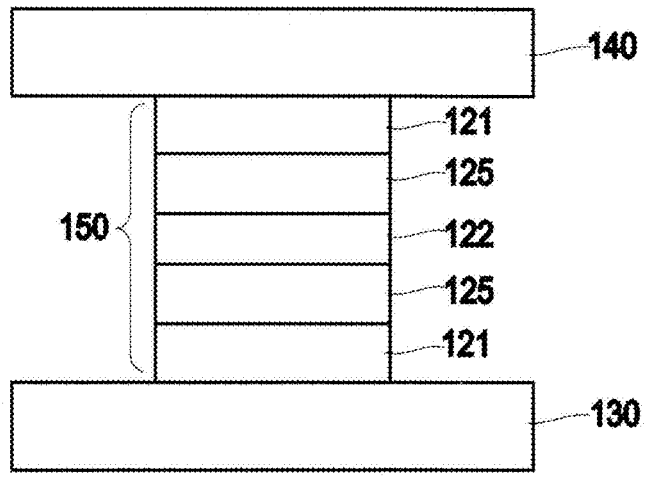
Figure 1F:
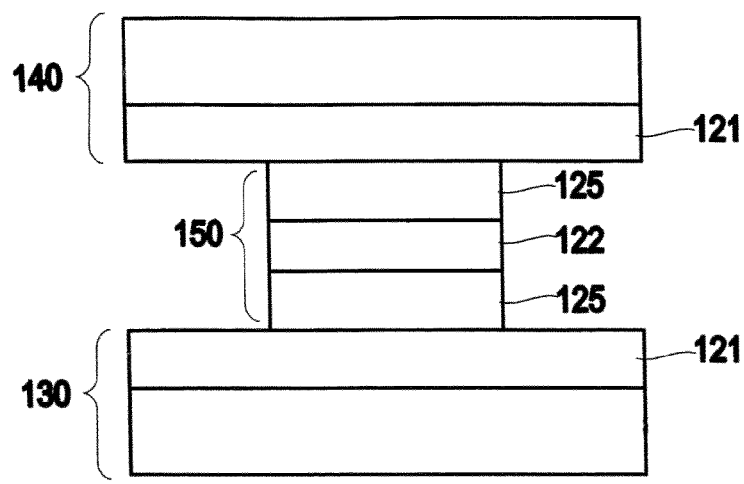

Other exemplary aspects are illustrated in FIGS. 1E-1F. For example, as illustrated in FIG. 1E, the memory element may include a first and second leads 130, 140, and a pillar 150 which includes magnetic layers 121 formed adjacent to the leads 130, 140, barrier layers 125 formed adjacent to the magnetic layers 121, and a second magnetic layer 122 formed between the barrier layers 125.

FIG. 1F illustrates a magnetic memory element which is similar to that in FIG. 1E. However, the magnetic memory element of FIG. 1F does not include the magnetic layers 121 as part of the pillar 150. Instead, the magnetic layers 121 are formed as part of the first and second leads 130, 140.

The magnetic layers of the spin-current switched magnetic memory element may include composite layers which may include, for example, a magnetic layer and a non-magnetic metal layer (e.g., cobalt and gold composite layers, cobalt and platinum composite layers, etc.). In such a composite layer, a perpendicular magnetic anisotropy component may be provided at an interface between layers (e.g., between a magnetic layer and a non-magnetic layer) in the composite magnetic layers. For example, FIGS. 2A-2B illustrate a spin-current switched magnetic memory element 200 having composite magnetic layers 121, 122.

Figure 2A:
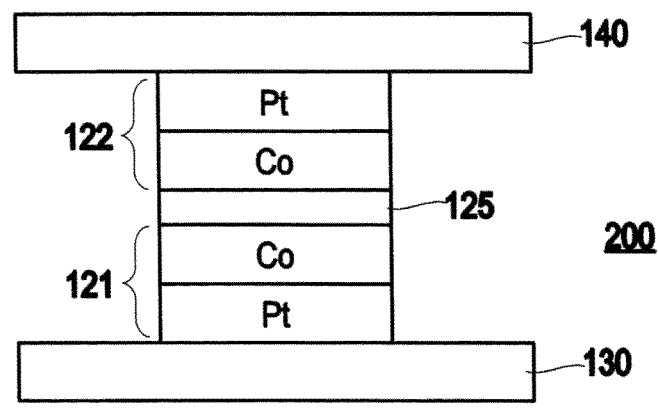
FIGS. 2A-2B illustrate a spin-current switched magnetic memory element 200, in accordance with an exemplary aspect of the present invention.

Specifically, FIG. 2A illustrates a magnetic memory element 200 having first and second leads 130, 140, and a first composite magnetic layer 121 including a layer of cobalt formed on a layer of platinum, a barrier layer (e.g., tunneling barrier layer) 125 formed on the first composite layer 121, and a second composite layer 122 including a layer of platinum formed on a layer of cobalt, which is formed on the barrier layer 125.

Figure 2B:
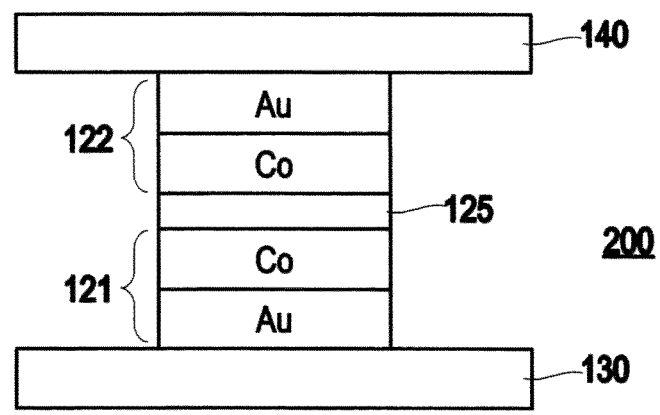

FIG. 2B illustrates another aspect in which the magnetic memory element 200 having first and second leads 130, 140, and a first composite magnetic layer 121 including a layer of cobalt formed on a layer of gold, a barrier layer (e.g., tunneling barrier layer) 125 formed on the first composite layer 121, and a second composite layer 122 including a layer of gold formed on a layer of cobalt, which is formed on the barrier layer 125.

The composite magnetic layers may have a form and function as described above with respect to magnetic layers 121, 122 in FIGS. 1A-1F. For example, the composite layers may be included as part of the pillar 150 or lead 130, 140, as noted above.

Figure 3:
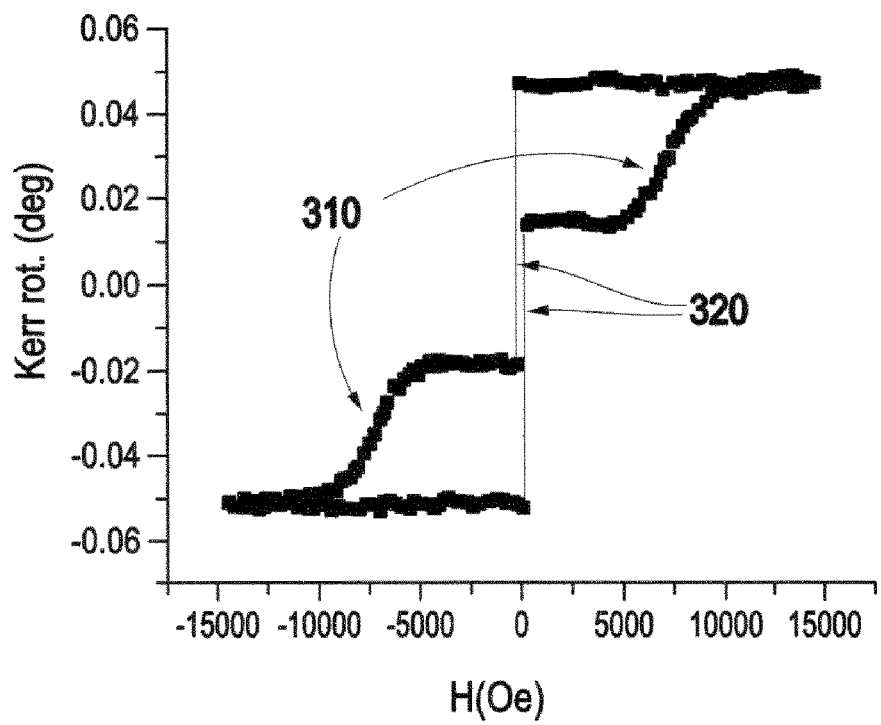
FIG. 3 illustrates a graph plotting magnetic rotation (as measured by polar Kerr signal) corresponding to the reversal of perpendicular magnetization in a plurality of layers consisting of 100 Å Pt/5 Å Co/10 Å Pt/15 Å Co/50 Å Au arrangement (e.g., a thin film stack), according to an exemplary aspect of the present invention.

To demonstrate the feasibility of using an interface-originated perpendicular magnetic anisotropy component to control the magnetic switching field, FIG. 3 illustrates the magnetic rotation as indicated by polar Kerr signal of a Pt—Co—Pt—Co layer structure. Specifically, FIG. 3 provides a graph plotting magnetic rotation (as measured by polar Kerr signal which is sensitive to the perpendicular component of the magnetization) corresponding to the reversal of the perpendicular magnetizations in the two cobalt layers according to an exemplary aspect of the present invention.

In the example of FIG. 3, the plurality of layers (in this experiment extended rather than confined within a pillar) includes a platinum layer having a thickness of 100 Å, a cobalt layer having a thickness of 5 Å, a platinum layer having a thickness of 10 Å, a second cobalt layer having a thickness of 15 Å, and a gold layer having a thickness of 50 Å. As indicated by the graph in FIG. 3, such structures can be engineered to have separate switching fields (switching field 310 or the higher value, corresponding to the thinner cobalt layer, and switching field 320, the lower field, corresponding to the thicker cobalt layer. Field is applied perpendicular to the film surface in this experiment. Only the higher value, ranging from 6000 to 10000 Oe represents a perpendicular anisotropy attainable in a pillar). The same layer design can be applied to the fabrication of a current-perpendicular spin-valve-type of magnetic junction, and with the perpendicular anisotropy component engineered to reduce switching current $I_c$.

Figure 4:
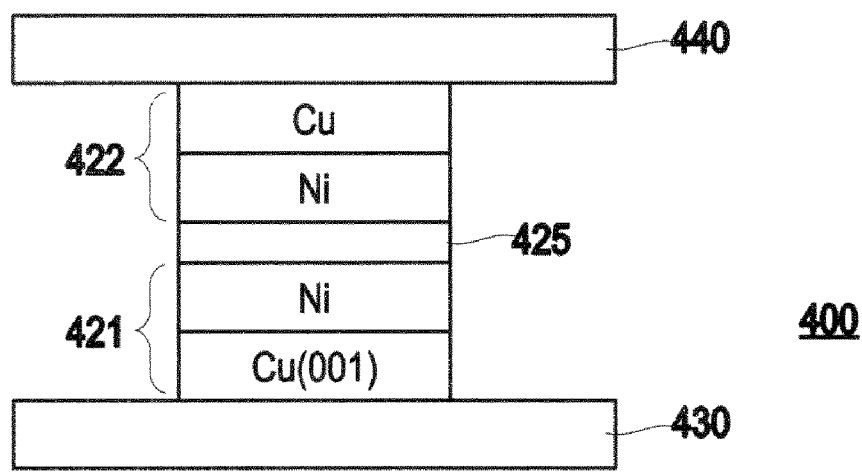
FIG. 4 illustrates a spin-current switched magnetic memory element 400, in accordance with an exemplary aspect of the present invention.

Another exemplary aspect of the present invention is illustrated in FIG. 4. Unlike the memory element 200 illustrated in FIGS. 2A-2B in which the perpendicular magnetic anistropy may be formed at an interface between layers in the composite magnetic layers, the spin-current switched magnetic memory element 400 may include a bulk perpendicular magnetic anisotropy component in at least one of the magnetic layers.

For example, the spin-current switched magnetic memory element 400 may include first and second leads 430, 440, a first composite magnetic layer 421 including a nickel layer formed on a copper layer, a barrier layer (e.g., tunneling barrier layer) 425 and a second composite layer 422 including a copper layer formed on a nickel layer. Specifically, in this exemplary aspect, the layers may be formed in this sequence (e.g., or the reverse sequence): a first magnetic layer 421 including a copper layer (e.g., epitaxial Cu(001)) and a first nickel layer Ni, a tunneling barrier layer 425 (e.g., Magnesium oxide), and a second magnetic layer 422 including a second nickel layer Ni, and a second copper layer. Thus, this structure of the plurality of layers may be identified as (001) Cu/Ni(a)/MgO/Ni(b)/Cu(001).

In this exemplary aspect, the first nickel layer included in composite magnetic layer 421 is under a strain and has a perpendicular magnetic anisotropy component. Further, the first copper layer (e.g., epitaxial Cu(001)) included in composite magnetic layer 421 may also be strained, however the strain is mostly a reaction to the first nickel layer in layer 421. In addition, the copper layer in composite layer 421 could be strained further by selecting a different substrate.

The second magnetic layer 422 is the "fixed" layer. This layer may or may not need to have perpendicular anisotropy component, depending upon the final magnetic anisotropy component achieved in the first magnetic layer 421.

The electric resistance of the spin-current switched magnetic memory element (e.g., the pillar of layers) may depend on the magnetization direction of the first nickel layer Ni in the composite layer 421 by virtue of the tunneling magnetoresistance phenomenon. Because the magnetic anisotropy of nickel in this structure is nearly uniaxial, the electric current needed for spin-transfer (e.g., "spin-injection current") switching is much lower than that known experimentally for switching in-plane oriented magnetic moments.

This exemplary aspect is different from the aspect discussed above and illustrated, for example, in FIGS. 2A-2B, which may include, for example, a multilayer incorporating cobalt and gold, or cobalt and platinum (e.g., Co/Au or Co/Pt). In that earlier aspect, the perpendicular magnetic anisotropy component is an interface effect and, therefore, to maintain a reasonably strong perpendicular anisotropy field for the entire magnetic layer, the magnetic layer (e.g. Cobalt) may have its thickness limited to just a few atomic layers.

In this exemplary aspect of the present invention, on the other hand, the anisotropy is caused by magnetoelastic effects in the bulk. Therefore, the magnetic layers (e.g. Nickel) can be thicker, up to 12 nm (for nickel for example), and the amount of effective anisotropy is less sensitive to roughness of interfaces.

In most commonly used magnetic memory elements, the resting directions (or the easy-axis) of both the switching magnet (the "free" layer) and the reference magnet (the "fixed" or "pinned" layer) are collinear. That is, the free layer is either parallel or antiparallel to the fixed layer in its magnetization, representing the two binary logic states of zero or one.

In all exemplary structures discussed above, the perpendicular anisotropy component introduced through either interface or bulk strain can, but does not need to, completely overcome the shape-anisotropy-induced easy-plane magnetic anisotropy. That is, $H_p$ needs to be close to but does not have to exceed, $4\pi M_s$. When $H_p > 4\pi M$, the nanomagnet layer responsible for switching (e.g., the "free" layer) will have its stable magnetization direction perpendicular to the thin film surface, either pointing up or down, representing the 0 and 1 state of information.

In this case, the fixed, or reference layers of magnetic thin film(s) should be engineered to have its (their) magnetization resting in the perpendicular direction as well so as to provide the correct reference direction, both for writing and for reading the magnetic bit. This geometry may have superior magnetic stability over arrangements where the thin film magnetization stays within the thin film plane.

However, it is often non-trivial to engineer more than one magnetic thin film in the stack to have a perpendicular magnetic anisotropy component strong enough to overcome the demagnetization. This is particularly so if the perpendicular anisotropy component originates from a strained thin film state which may require epitaxial growth as shown in the example associated with FIG. 4. If such is the case, it may be simpler and easier to engineer the perpendicular anisotropy component in the "free" layer to be just below that of the demagnetization field $4\pi M_s$. That is, to have $Hp \leq 4\pi M_s$, so that $4\pi M_s - H_p \sim H_k$. This way, the "free" layer's magnetization will still rest within the thin film plane, but it will be allowed to rotate out of the thin film plane upon spin-current excitation.

Since the resting position of the "free" layer remains within the thin film plane, the reference magnetic layer also need only have its magnetization resting wihthin the thin film plane. This way, one is able to avoid the difficult task of trying to engineer a structure where the fixed magnetic layer would also have to have its magnetization rest perpendicular to the film surface. This will significantly lower the complexity of device materials engineering, making the implimentation of the device design illustrated in FIG. 4 relatively straightforward.

It is important to note that in any of the above-discussed aspects of the present invention (e.g., FIGS. 1A-4), the incorporation of the tunneling barrier into the plurality of layers (e.g., pillar) suitable for spin-transfer switching helps to provide a practical signal voltage. Such combination of a tunnel barrier and spin-transfer switch has not been successfully attempted because in conventional devices the large switching current needed for in-plane switching exceeds the maximum junction current and this will destroy the junction.

The current needed for switching of nanomagnets without strong easy-plane demagnetization field (as discussed above) will be much smaller (e.g., less than about $10^6$ A/cm$^2$) in the present invention. In addition, recent progress in junction fabrication has improved the maximum allowed junction current quite significantly (e.g., well above $10^6$ A/cm$^2$). Therefore, the present invention (e.g., device) will switch nondestructively. Specifically, the magnetic memory element according to the present invention, may include a magnetic tunneling junction which is formed with two magnetic layers separated by a tunneling barrier. Thus, the inventive spin-current switched magnetic memory element may include a magnetic tunneling junction-based spin-injection switch.

As noted above, there is an intense search for a current-switchable magnetic tunneling based device for memory applications. However, to date no clear demonstration has been made that such spin-transfer-based magnetic switching exists in magnetic tunneling junctions because the breakdown current density is too low in conventional magnetic tunneling devices, typically below $10^5$ A/cm$^2$ These limitations have been removed by the rapid technological development by the read-head engineering effort in search for low-impedance magnetic tunneling junctions. For example, recently there have been multiple credible reports that breakdown current densities in excess of $3 \times 10^6$ A/cm$^2$ can be achieved with the current-generation low-impedance magnetic tunneling junctions (e.g., with resistance area (RA) of about 2 Ohms-micron$^2$).

The successful demonstration of magnetic tunneling junctions with a perpendicular magnetic anisotropy has also been recently reported. In these reports, researchers reported succeeding in the fabrication of Pt|Co|AlOx|Co| magnetic tunneling junctions, where the Pt|Co layer can be conditioned to retain a perpendicular magnetic anisotropy depending upon optimal barrier oxidation.

The reported structure, however, merely demonstrates the successful combination of a perpendicular anistropy materials system (Pt/Co) with that of a tunneling barrier. The present invention, on the other hand, may include the construction of a device with lateral dimensions less than 100 nm (e.g., important to switching under spin-transfer) and with a tunnel barrier capable of supporting a current density which is greater than $3 \times 10^6$ A/cm$^2$ so as to be used as a current-controlled magnetic switch.

In the present invention, a magnetic thin film system with a perpendicular anisotropy component will remove the large demagnetization field, and result in a reduction of injection spin-current density by at least an order of magnitude, as discussed above. This brings the value to within the demonstrated current density of about $3 \times 10^6$ A/cm$^2$, hence enabling the fabrication of a tunneling-based spin-injection device.

To date, all spin-current-switchable junctions have been fabricated using a non-magnetic metal separation layer (e.g., a Co—Cu—Co current-perpendicular spin valve). Such devices have very low impedances, typically on the order of 1-10 Ohms for device structures around 0.05 to 0.1 microns in lateral size. Such low impedance and the relatively small amount of magnetoresistance (on the order of 3-6%) means the usable signal is too weak for high-speed read-out in a conventional CMOS circuit.

A tunneling-based spin-injection switch will have larger device impedance, as well as a larger signal output to properly match into the read circuit for magnetic random access memory (MRAM). In fact, magnetic tunneling junction is by and large what enabled the current-generation MRAM architecture.

A magnetic tunneling switch will enable the further scaling of MRAM down to below 30 nm in junction size, and allow for superior write-disturbance characteristics compared to the designs of conventional magnetic memory devices. This represents a major opportunity for the advance of MRAM technology.

Furthermore, a two-terminal bi-stable magnetic switch with relatively high impedance and signal level is, from a circuit's perspective, very similar to other types of memory elements (e.g., ovonic unified memory (OUM) type, perovskite resistive memory, etc.) that are currently being developed. The present invention has all the advantages of speed and nonvolatility MRAM has to offer, and at the same time is compatible with the circuit architecture of the other types of two-terminal resistive-switching memories, making it a much a broad-based memory element technology for future generations of MRAM and for system integration.

By tuning the thicknesses of the magnetic layers (e.g., in FIGS. 2A-2B, the thicknesses of the cobalt layers may range from about 3-4 angstroms upwards to about 10 angstroms), the present invention is able to obtain different perpendicular anisotropy fields for the magnetic layers adjacent to the tunneling barrier layer (e.g., the top magnetic layer and the bottom magnetic layer). This will give a unique switching threshold current for the weaker of the two magnetic layers to be switched by current injection across the tunneling barrier layer. The tunneling barrier layer may include AlOx, or other, more advanced barrier materials such as MgO.

The present invention may also include different types of materials with a perpendicular anisotropy component. For example, the tunneling barrier layer may be formed between composite magnetic layers including platinum and cobalt (e.g., thin platinum and cobalt layers), or composite magnetic layers formed of nickel and copper (e.g., the nickel and copper layers may have a combined thickness which is greater than the combined thickness of the platinum and cobalt layers), respectively. This would achieve the differentiation of anisotropy energies between the two magnetic layers to provide a uniquely defined switching current for magnetic reversal.

While the thinner of the two magnetic layers can derive its perpendicular anisotropy component from interface effects, a thicker layer of ferromagnet (e.g., a thick nickel layer) can obtain its perpendicular anisotropy component from other mechanisms such as strain (e.g., as in the case of the nickel and copper layers), thus achieving independent control over the magnetic anisotropies of the two layers.

Another exemplary aspect of the present invention includes a method of fabricating a spin-current switched magnetic memory element. The method may include, for example, forming a plurality of magnetic layers, at least one of the plurality of magnetic layers having a perpendicular magnetic anisotropy component and including a current-switchable magnetic moment, and forming at least one barrier layer adjacent to at least one layer in the plurality of magnetic layers. The inventive method may include all of the features and functions described above with respect to the inventive spin-current switched magnetic memory element.

Figure 5:
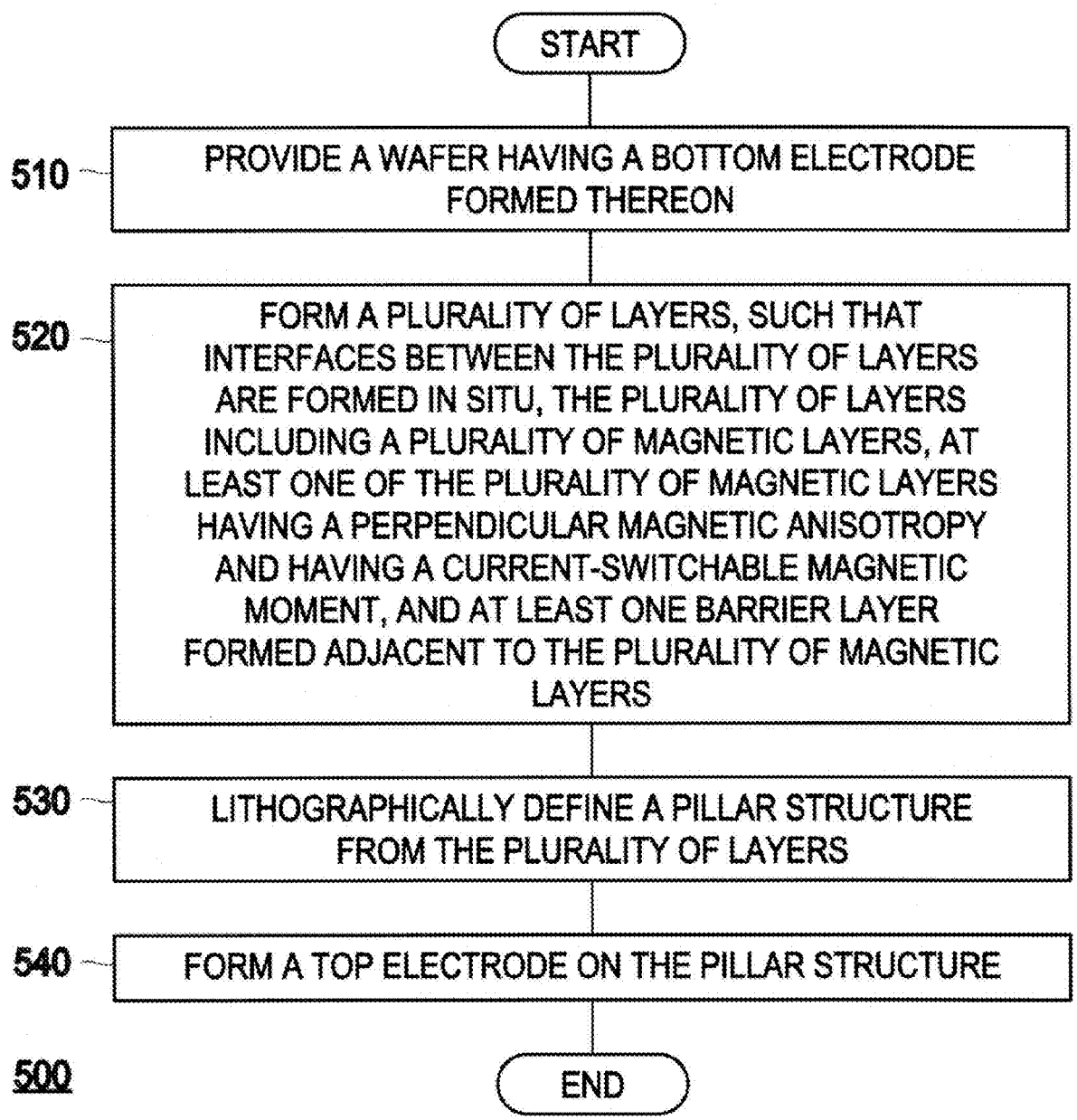
FIG. 5 illustrates method 500 for fabricating a spin-current switched magnetic memory element, in accordance with an exemplary aspect of the present invention.

FIG. 5 illustrates an exemplary aspect of the method of fabricating a spin-current switched magnetic memory element according to the exemplary aspects of the present invention. As illustrated in FIG. 5, the method 500 of fabricating a spin-current switched magnetic memory element includes providing (510) a wafer having a bottom electrode formed thereon, forming (520) a plurality of layers, the plurality of layers including a plurality of magnetic layers, at least one of the plurality of magnetic layers having a perpendicular magnetic anisotropy component and including a current-switchable magnetic moment, and at least one barrier layer formed adjacent to said plurality of magnetic layers, lithographically defining (530) a pillar structure from the plurality of layers, and forming (540) a top electrode on said pillar structure.

It should be noted that the barrier layer(s) may be formed during the formation of the plurality of magnetic layers. For example, the method may include forming a first magnetic layer, forming a barrier layer on the first magnetic layer, and forming a second magnetic layer on the barrier layer. Another barrier layer may then be formed on the second magnetic layer, and so on.

In summary, the present invention utilizes at least three important concepts. First, the use of perpendicular anisotropy materials, either Pt|Co|TB|Co|Pt or |Cu|Ni|TB|Ni|Cu (e.g., where TB is a tunneling barrier) can lower the switching current, to below $10^6$ A/cm$^2$. In addition, a modern magnetic tunnel junction with AlOx or MgO barrier has been refined to have break-down currents above $3 \times 10^6$ A/cm$^2$. The novel combination of these two factors yields a new and novel device structure which may include a current-switchable magnetic tunneling junction.

The present invention also utilizes the concepts of different types of magnetic anisotropies. For example, a uniaxial anisotropy ($H_k$) is usually in a direction in the film plane, and is quite often defined by a thin film's elongated shape in the plane (hence, a pillar including the thin film is usually not "cylindrical"). $H_k$ may be considered the "good" anisotropy, since it may define the bit direction and stability.

On the other hand, the term $4\pi M_s$ may be considered the "bad" anisotropy since it increases switching current for no apparent benefit. The use of perpendicular anisotropy, either interface or bulk, to "nearly" balance out the effect of $4\pi M_s$ includes two possible situations. One possibility is with the magnetization resting in the direction perpendicular to the film surface, the other with the moment still lying in the film plane but it would be very easy to rotate it out of the plane. Both can be used for the present invention, although the second type (e.g., in-plane but easy to rotate out) is the easiest to practically implement, since it only uses one (e.g., the bottom, or the "free" magnetic layer, such as layer 121 in FIG. 1) ferromagnetic layer to have perpendicular anisotropy engineered into it, while the top, or the "fixed" ferromagnetic layer (such as element 122 in FIG. 1), need not to be magnetized in the perpendicular direction at all.

With its unique and novel features, the present invention provides a spin-current switched magnetic memory element having a switching current threshold which is significantly lower than that of conventional memory elements, and a method of fabricating the device.

While the invention has been described in terms of one or more exemplary embodiments, those skilled in the art will recognize that the invention can be practiced with modification within the spirit and scope of the appended claims. Specifically, one of ordinary skill in the art will understand that the drawings herein are meant to be illustrative, and the design of the inventive assembly is not limited to that disclosed herein but may be modified within the spirit and scope of the present invention.

Further, Applicant's intent is to encompass the equivalents of all claim elements, and no amendment to any claim the present application should be construed as a disclaimer of any interest in or right to an equivalent of any element or feature of the amended claim.

What is claimed is:

1. A method of fabricating spin-current switched magnetic memory element, comprising:
   forming a plurality of magnetic layers, comprising:
      forming a fixed magnetic layer having a fixed magnetic moment; and
      forming a free magnetic layer having a magnetic moment which is switchable by a spin-current; and
   forming a barrier layer formed between said fixed and free magnetic layers,
   wherein said plurality of magnetic layers includes a perpendicular magnetic anisotropy component, $H_p$, with a magnitude sufficient to at least substantially offset an easy-plane demagnetization effect $4\pi M_s$, where $M_s$, is a saturation magnetization, such that said perpendicular magnetic anisotropy component, $H_p$, reduces an amount of spin current needed to rotate said magnetic moment of said free magnetic layer out of the film plane, and wherein said perpendicular magnetic anisotropy component, Hp, comprises one of:

an interface-induced perpendicular magnetic anisotropy component originating at an interface within a multi-layer structure in the free magnetic layer;

a strain-induced perpendicular magnetic anisotropy component originating within at least one of the fixed magnetic layer and the free magnetic layer; and a crystalline anisotropy-induced perpendicular magnetic anisotropy component originating within at least one of the fixed magnetic layer and the free magnetic layer.

2. The method according to claim 1, wherein at least one of said fixed and free magnetic layers comprises a composite layer.

3. The method according to claim 2, wherein said composite layer comprises one of:

a platinum layer and a cobalt layer;

a gold layer and a cobalt layer; and a nickel layer and a copper layer.

4. The method according to claim 2, wherein said composite layer comprises a magnetic film and non-magnetic film, said perpendicular magnetic anisotropy component being formed at an interface between said magnetic film and said non-magnetic film of said composite layer.

5. The method according to claim 2, wherein said perpendicular magnetic anisotropy component comprises a bulk perpendicular magnetic anisotropy component which is formed in said magnetic film of the said composite layer.

6. The method according to claim 1, further comprising:

forming first and second leads; and forming a pillar between said first and second leads, said pillar including said barrier layer and at least one of said fixed and free magnetic layers.

7. The method according to claim 6, wherein said pillar comprises said free magnetic layer.

8. The method according to claim 6, wherein said magnetic moment of said free magnetic layer included in said pillar is switchable by an electrical current having a density of no more than about $10^6$ Å/cm$^2$.

9. The method according to claim 6, wherein said barrier layer preserves spin information for an electric current injected into said pillar and provides a resistance to said current.

10. The method according to claim 6, wherein at least one of said first and second leads includes one of said fixed and free magnetic layers.

11. The method according to claim 1, wherein said plurality of magnetic layers comprises an upper magnetic layer and a lower magnetic layer, said at least one barrier layer being formed between said upper and lower magnetic layers.

12. The method according to claim 11, wherein said upper magnetic layer comprises one of a platinum layer and a cobalt layer, and a gold layer and a cobalt layer.

13. The method according to claim 11, wherein said lower magnetic layer comprises one of a cobalt layer and a platinum layer, a cobalt layer formed on a gold layer, and a nickel layer and a copper layer.

14. The method according to claim 1, wherein said barrier layer comprises at least one of an aluminum oxide layer, a magnesium oxide layer, a doped semiconductor layer, a non-magnetic metal layer and a SrTiO$_3$ layer.

\* \* \* \* \*